United States Patent
Morris

[11] Patent Number: 5,894,234
[45] Date of Patent: Apr. 13, 1999

[54] DIFFERENTIAL COMPARATOR WITH FIXED AND CONTROLLABLE HYSTERESIS

[75] Inventor: Bernard L. Morris, Emmaus, Pa.

[73] Assignee: Lucent Technologies Inc., Murray Hill, N.J.

[21] Appl. No.: 08/846,390

[22] Filed: Apr. 30, 1997

[51] Int. Cl.$^6$ ............................... H03F 3/45; H03F 3/16
[52] U.S. Cl. .................. 327/65; 327/66; 327/67; 327/205; 327/206; 330/252; 330/260
[58] Field of Search .................. 327/65, 66, 67, 327/205, 206, 560, 561, 562, 563, 52, 53, 55; 330/252, 260

[56] References Cited

U.S. PATENT DOCUMENTS

| | | | |
|---|---|---|---|
| 4,110,641 | 8/1978 | Payne | 307/355 |
| 4,604,533 | 8/1986 | Miyamoto et al. | 307/530 |
| 4,754,169 | 6/1988 | Morris | 327/307 |
| 5,079,454 | 1/1992 | Benton et al. | 307/522 |
| 5,426,386 | 6/1995 | Matthews et al. | 327/63 |
| 5,530,444 | 6/1996 | Tice et al. | 341/156 |
| 5,541,538 | 7/1996 | Bacrania et al. | 327/77 |

*Primary Examiner*—Timothy P. Callahan
*Assistant Examiner*—An T. Luu

[57] ABSTRACT

A differential comparator having a low-offset comparator and two processing paths, each of which receives one of the two primary inputs to the differential comparator and generates one of the two inputs to the low-offset comparator. The output of the low-offset comparator is the output of the differential comparator. Each processing path is capable of (1) generating an offset voltage and (2) turning on and off the generation of that offset voltage. In a preferred embodiment, each processing path has a passive resistor that generates the offset voltage and a pair of shunt transistors that selectively shorts out the passive resistor. The output of the low-offset comparator is connected (either directly or indirectly through an inverter) to the gates of the shunt transistors. The shunt transistors are therefore controlled by the output of the low-offset comparator. In each of two modes of operation, a different one of the passive resistors is "on" while the other passive resistor is "off." The result is a differential comparator that operates with hysteresis. The currents passing through the passive resistors to generate the offset voltages are mirrored from a current source that is controlled by a reference voltage. As such, the offset voltages can be controlled by adjusting the reference voltage. The differential comparator is capable therefore of operating with fixed and controllable hysteresis.

21 Claims, 2 Drawing Sheets

5,894,234

DIFFERENTIAL COMPARATOR WITH FIXED AND CONTROLLABLE HYSTERESIS

BACKGROUND OF THE INVENTION

1. Field of the Invention

The present invention relates to electrical circuitry, and, in particular, to differential comparators.

2. Description of the Related Art

A differential comparator is an electrical circuit that compares two input voltages and generates an output voltage that indicates the relationship between the two inputs. For example, for a particular differential comparator, when the first input voltage is greater than the second input voltage, the output voltage from the differential comparator will be high. Similarly, when the first input voltage is less than the second input voltage, the output voltage will be low. Thus, the output voltage may be used to indicate which input voltage is greater.

In some applications, it is desirable to compare the two input voltages relative to an offset voltage. For example, an application may need to determine whether or not the first input voltage is greater than the sum of the second input voltage and an offset voltage. An offset voltage is said to be fixed, if its value can be maintained as a constant for one or more comparison operations. Similarly, an offset voltage is said to be controllable, if its value can be selectively changed for different comparison operations.

FIG. 1 shows a schematic diagram of a conventional differential comparator 100 having a fixed and controllable offset voltage. Comparator 100 has a current source X1 whose current ICS1 is mirrored by transistor MCS1 through transistors MCS2 and MCS3 to produce currents ICS2 and ICS3, respectively.

FIG. 2 shows a schematic diagram of current source X1 of FIG. 1. As shown in FIG. 2, a controllable reference voltage VREF is applied to the positive input of an operational amplifier (op-amp) OPCS1. The negative input comes from node FB, which is connected between a reference resistor RCS and the source of an N-channel transistors MFB. The output of the op-amp OPCS1 goes to the gate of transistor MFB. In this manner, the voltage at node FB is forced to be equal to VREF, so that the current through transistor MFB is equal to VREF/RCS (i.e., ICS1 of FIG. 1).

Referring again to FIG. 1, the inputs to differential comparator 100 are applied at nodes P and N, which are in turn applied to the gates of P-channel transistors M1 and M2, respectively. If the current densities through transistors M1 and M2 are kept equal, then the gate-to-source voltages VGS will be equal in M1 and M2. Node P1 will then be at voltage P+VGS1, while node N1 will be at voltage P+VGS2.

Current ICS2 is forced through both resistor RP and transistor M1. The voltage drop DelV across resistor RP is therefore equal to ICS2×RP. Since the current ICS2 is equal to the current ICS1 times the transistor-size ratio MCS2/MCS1, the following relation of Equation (1) applies:

$$DelV = ICS1 \times (MCS2/MCS1) \times RP = VREF \times (MCS2/MCS1) \times (RP/RCS) \qquad (1)$$

If resistors RIP and RCS are made on a single integrated circuit from the same material (e.g., N-tub, P+ source-drain), then the ratio of RP/RCS is a constant fixed by the geometric layout. Similarly, the ratio MCS2/MCS1 is also fixed by geometry (i.e., the transistor channel widths). Thus, the voltage drop DelV across resistor RP is directly proportional to the reference voltage VREF.

Node N1 is connected to the negative input of comparator X2 and node P2 (which is equal to P1+DelV) is connected to the positive input of comparator X2. Comparator X2 is a low-offset comparator in that it has low or negligible offset (e.g., typically less than 10 mvolts). Such comparators are often referred to in the art as zero-offset comparators. As configured, the difference between the voltage levels at nodes N1 and P2 (i.e., the inputs to comparator X2) is offset by DelV from the difference between the voltage levels at primary inputs N and P. As such, comparator 100 can be described as a differential comparator with a fixed and controllable offset voltage. The offset voltage can be controlled by changing the reference voltage VREF.

Comparator 100 operates adequately for many applications. There are, however, certain applications for which it is desirable to use a differential comparator having fixed and controllable Hysteresis. Comparator 100 is not appropriate for such applications.

Further aspects and advantages of this invention will become apparent from the detailed description which follows.

SUMMARY OF THE INVENTION

Embodiments of the present invention are directed to an integrated circuit having a differential comparator adapted to receive first and second primary inputs and to generate an output corresponding to a comparison between the first and second primary inputs. The differential comparator comprises (a) a low-offset comparator adapted to generate the output of the differential comparator in response to two inputs; (b) a first processing path adapted to receive the first primary input and to generate a first input to the low-offset comparator; and (c) a second processing path adapted to receive the second primary input and to generate a second input to the low-offset comparator. At least one of the first and second processing paths comprises (1) passive means for generating an offset voltage relative to the corresponding primary input; and (2) means for switching on and off the corresponding passive voltage-generating means.

In alternative embodiments of the present invention, the differential comparator comprises (a) a current source (e.g., X1 in FIG. 3) adapted to generate a first current (e.g., ICS1); (b) a first transistor (e.g., MCS1) connected to the current source; (c) second and third transistors (e.g., MCS2 and MCS3) connected to the first transistor to mirror the first current; (d) a first passive resistor (e.g., RP) connected to the second transistor; (e) a first pair of shunt transistors (e.g., MSH1 and MSH2) connected in parallel to the first passive resistor; (f) a first input transistor (e.g., M1) connected to the first passive resistor and adapted to receive the first primary input (e.g., P) at the gate of the first input transistor; (g) a second passive resistor (e.g., RN) connected to the third transistor; (h) a second pair of shunt transistors (e.g., MSH3 and MSH4) connected in parallel to the second passive resistor; (i) a second input transistor (e.g., M2) connected to the second passive resistor and adapted to receive the second primary input at the gate of the second input transistor; (j) a low-offset comparator (e.g., X2) connected at a first input (e.g., P) to a node (e.g., P2) between the second transistor and the first passive resistor, connected at a second input (e.g., N) to a node (e.g., N2) between the third transistor and the second passive resistor, and connected at the output to the gates of the second and fourth shunt transistors, wherein the output of the low-offset comparator is the output of the differential comparator; and (k) an inverter (e.g., X3) connected at its input to the output of the low-offset comparator, connected at its output to the gates of the first and third shunt transistors, and adapted to invert the output of the low-offset comparator.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

The present invention is directed to differential comparators having fixed and controllable hysteresis. Having hysteresis means that the input conditions that will cause a differential comparator of the present invention to switch from a low voltage output to a high voltage output are different from the input conditions that will cause that differential comparator to switch from the high voltage output to the low voltage output. In particular, hysteresis means that the input differential required to switch the output voltage from low to high is greater than the input differential at which the output voltage will switch from high to low. According to embodiments of the present invention, the magnitude of the hysteresis (i.e., the difference between the two input differentials) is both fixed and controllable.

Figure 1:
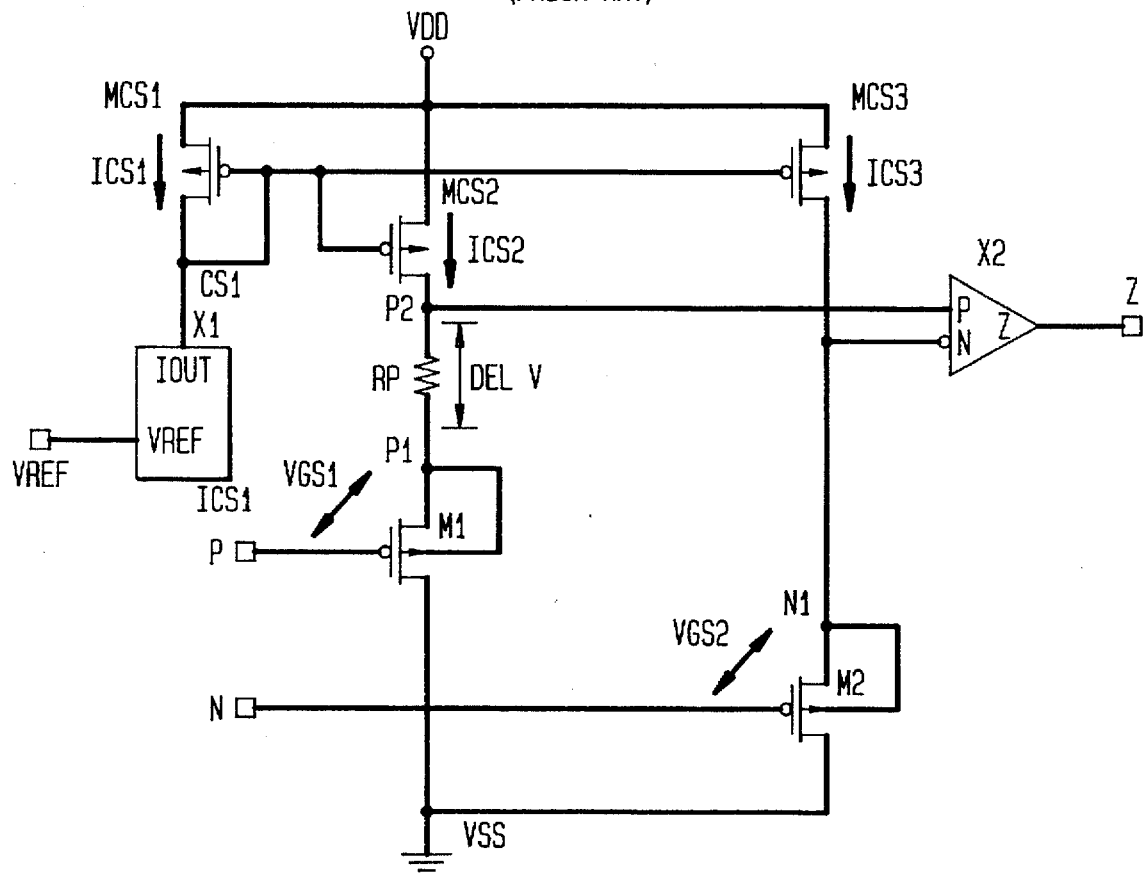
FIG. 1 shows a schematic diagram of a conventional differential comparator having a fixed and controllable offset voltage.
Figure 2:
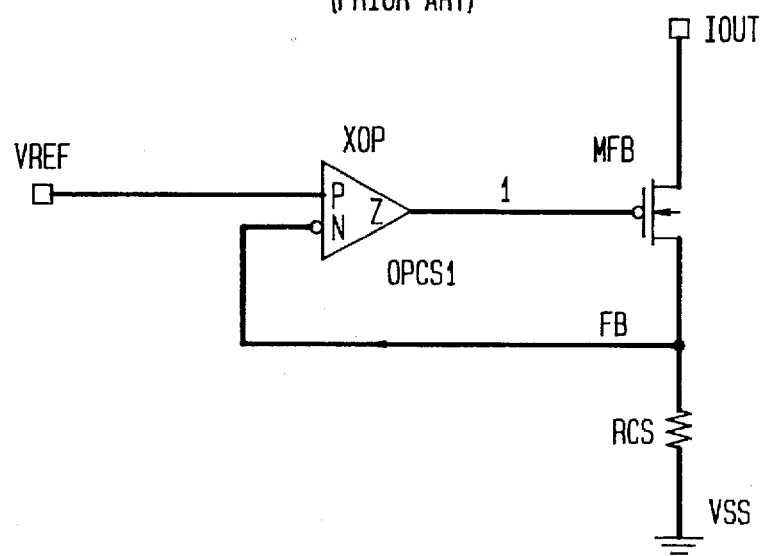
FIG. 2 shows a schematic diagram of the current source of FIG. 1.
Figure 3:
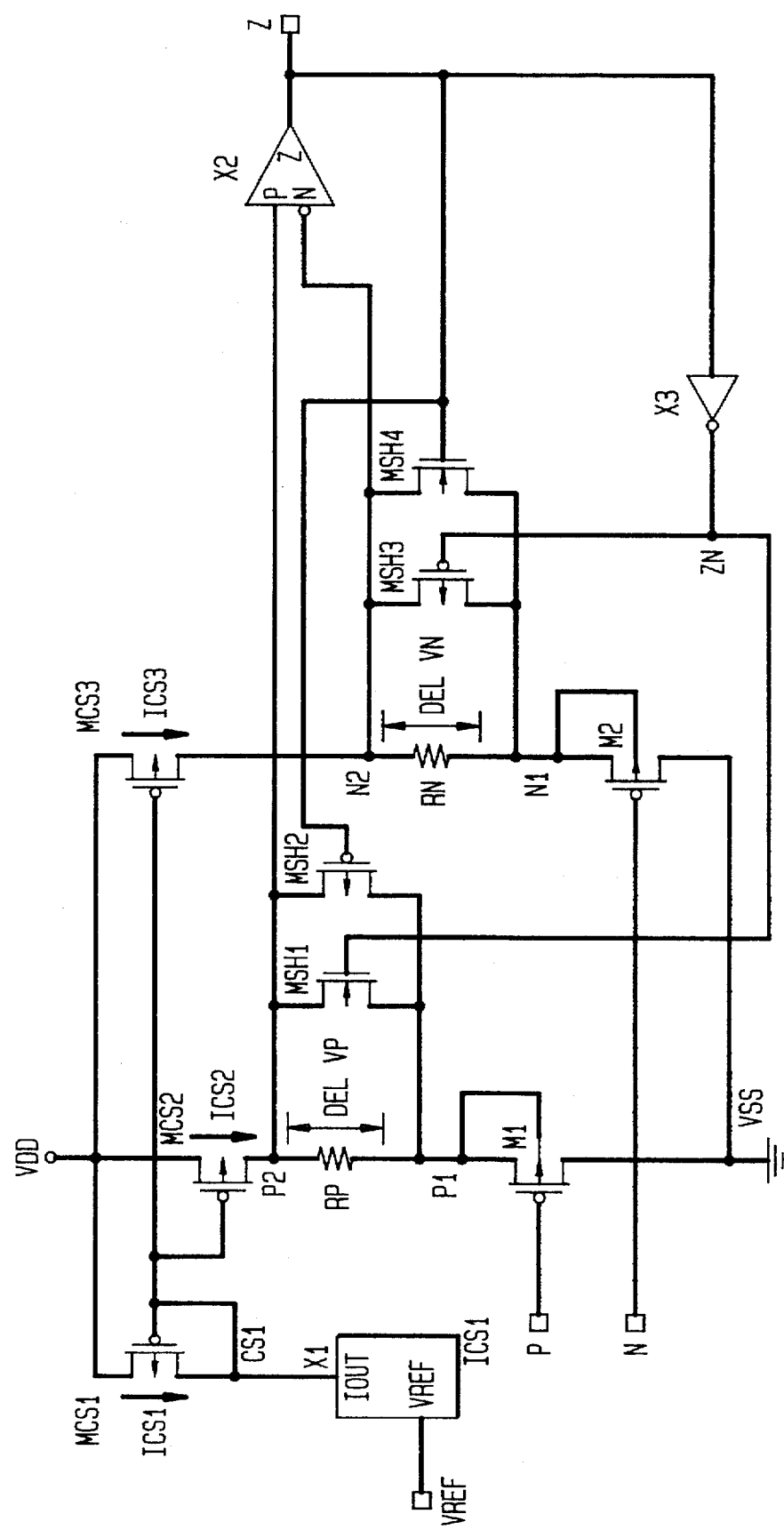
FIG. 3 shows a schematic diagram of a differential comparator, according to one embodiment of the present invention.

FIG. 3 shows a schematic diagram of differential comparator 300, according to one embodiment of the present invention. Comparator 300 is designed to operated with both fixed and controllable hysteresis. Comparator 300 is based in part on the design of conventional differential comparator 100 of FIG. 1. In particular, current source X1, transistors MCS1, MCS2, MCS3, M1, and M2, and comparator X2 of differential comparator 300 are analogous to corresponding components in differential comparator 100. In one implementation, current source X1 is as shown in FIG. 2. Unlike conventional comparator 100, however, which has only one voltage drop resistor RP, comparator 300 has two voltage drop resistors, RP and RN, across which each has shunt transistors connected in parallel.

In particular, N-channel transistor MSH1 and P-channel transistor MSH2 are used to shunt resistor RP, and P-channel transistor MSH3 and N-channel transistor MSH4 are used to shunt resistor RN. These transistors are sized so that their "on" resistances are much less than the resistances of the resistors across which they are connected. The gates of transistors MSH1–4 are connected to either the output Z of comparator X2 or to its inverse ZN (generated by inverter X3). The input to the gate of transistor MSH1 and the input to the gate of transistor MSH3 have opposite polarity. Similarly, the input to the gate of transistor MSH2 and the input to the gate of transistor MSH4 have opposite polarity. As such, only one of resistors RP and RN is shunted at any time.

When primary input P is significantly lower than primary input N, node P2 will be lower than node N2, and the output Z of comparator X2 will thus be low. In this mode of operation, the shunt transistors that are connected across resistor RP will be "on" (thereby effectively shorting out resistor RP), while the shunt transistors connected across resistor RN are "off." In this mode, comparator X2 will see the following input voltages:

$$P2=P+VGS(M1) \text{ and } N2=N+VGS(M2)+DelVN,$$

where P and N are the primary inputs to comparator 300, VGS(M1) and VGS(M2) are the gate-to-source voltages of transistors M1 and M2, respectively, and DelVN is the voltage drop across resistor RN. If VGS(M1) and VGS(M2) are equal, then primary input P will have to be DelVN greater than primary input N in order to switch the output Z of comparator X2 from low to high.

As soon as the output Z does switch from low to high, the shunt transistors connected across resistor RP will turn off, while the shunt resistors connected across resistor RN will turn on (thereby effectively shorting out resistor RN). In this mode of operation, comparator X2 will see the following input voltages:

$$P2=P+VGS(M1)+DelVP \text{ and } N2=N+VGS(M2),$$

where DelVP is the voltage drop across resistor RP. This means than primary input N will have to be DelVP less than primary node P in order to switch the output Z of comparator X2 from high to low. The total hysteresis of differential comparator 300 is therefore (DelVP+DelVN), and the magnitude of the total hysteresis can be controlled by adjusting the reference voltage VREF.

If differential comparator 300 is implemented as a single integrated circuit, the hysteresis will be substantially independent of process variations, temperature, and voltage levels VDD and VSS.

In a preferred embodiment, resistors RP and RN are passive resistors, for example, of the diffusion or polysilicon type; that is, they are not transistors.

In the embodiment of FIG. 3, there are two processing paths, each of which receives a primary input (i.e., either P or N) and generates one of the two inputs to low-offset comparator X2. In differential comparator 300, each of these processing paths has means for generating an offset voltage (i.e., either resistor RP or RN) and means for switching on and off that resistor (i.e., either shunt transistors MSH1 and MSH2 or shunt transistors MSH3 and MSH4). Alternative embodiments of the present invention are also possible.

For example, a differential comparator falling within the scope of the present invention could be designed such that only one of the processing paths has an offset-voltage-generating resistor and a pair of shunt transistors to switch the resistor on and off. Such a differential comparator would exhibit "unbalanced" hysteresis half the size of the hysteresis of an analogous implementation of comparator 300 of FIG. 3.

In another alternative embodiment, one processing path could have a switched resistor (i.e., with shunt transistors), while the other processing path has a permanent resistor (i.e., unswitched). If the switched resistor was twice as large as the unswitched resistor, the resulting differential comparator would have a balanced hysteresis similar to that of comparator 300 of FIG. 3.

In yet another alternative embodiment, a single resistor could be used for both processing paths with appropriate switching components to switch the single resistor between processing paths.

The use of figure reference labels in the claims is intended to identify one or more possible embodiments of the claimed subject matter in order to facilitate the interpretation of the claims. Such labeling is not to be construed as necessarily limiting the scope of those claims to the embodiments shown in the corresponding figures.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit having a differential comparator configured to receive first and second primary inputs and to generate an output corresponding to a comparison between the first and second primary inputs, the differential comparator comprising:
   (a) an offset comparator configured to generate the output of the differential comparator in response to first and second comparator inputs;
   (b) a first processing path configured to receive the first primary input and to generate the first comparator input; and
   (c) a second processing path configured to receive the second primary input and to generate the second comparator input, wherein at least one of the first and second processing paths comprises:
      (1) passive means for generating an offset voltage relative to a corresponding one of the first and second primary inputs; and
      (2) switching means for switching in and out the passive means, wherein:
   the first processing path has the passive means and the switching means; and
   the second processing path has an unswitched passive voltage-generating means.

2. The invention of claim 1, wherein the passive means is a passive resistor, and the switching means is a pair of shunt transistors connected in parallel with the passive resistor.

3. The invention of claim 1, wherein the switching means is controlled by the output of the differential comparator.

4. The invention of claim 1, wherein the switching means is configured to switch in and out the passive means to cause the differential comparator to operate with hysteresis.

5. The invention of claim 4, wherein the offset voltage from the passive means is controllable such that the hysteresis is controllable.

6. The invention of claim 4, wherein the offset voltage from the passive means is fixed such that the hysteresis is fixed.

7. The invention of claim 5, wherein the passive means is a passive resistor, the switching means is a pair of shunt transistors connected in parallel with the passive resistor, and the pair of shunt transistors is controlled by the output of the differential comparator.

8. The invention of claim 1, wherein only one processing path has the passive means and the switching means.

9. The invention of claim 1, wherein:
   the first processing path has a switched passive voltage-generating means and a switching means; and
   the second processing path has an unswitched passive voltage-generating means.

10. The invention of claim 1, wherein both processing paths share the passive means.

11. An integrated circuit having a differential comparator configured to receive first and second primary inputs and to generate an output corresponding to a comparison between the first and second primary inputs, the differential comparator comprising:
   (a) a current source configured to generate a first current;
   (b) a first transistor connected to the current source;
   (c) second and third transistors connected to the first transistor to mirror the first current;
   (d) a first passive resistor connected to the second transistor;
   (e) first and second shunt transistors connected in parallel to the first passive resistor;
   (f) a first input transistor connected to the first passive resistor and configured to receive the first primary input at the gate of the first input transistor;
   (g) a second passive resistor connected to the third transistor;
   (h) third and fourth shunt transistors connected in parallel to the second passive resistor;
   (i) a second input transistor connected to the second passive resistor and configured to receive the second primary input at the gate of the second input transistor;
   (j) an offset comparator connected at a first comparator input to a node between the second transistor and the first passive resistor, connected at a second comparator input to a node between the third transistor and the second passive resistor, and connected at the output to the gates of the second and fourth shunt transistors, wherein the output of the offset comparator is the output of the differential comparator; and
   (k) an inverter connected at its input to the output of the offset comparator, connected at its output to the gates of the first and third shunt transistors, and configured to invert the output of the offset comparator.

12. The invention of claim 11, wherein the current source is controllable.

13. The invention of claim 11, wherein the current source comprises:
   (1) an operational amplifier connected to receive a reference voltage at a first input;
   (2) a transistor connected at its gate to the output of the operational amplifier; and
   (3) a resistor connected to the source of the transistor at a node that is further connected to a second input of the operational amplifier.

14. The invention of claim 13, wherein voltage drops across the first and second passive resistors are proportional to the first current and the first current is proportional to the reference voltage VREF.

15. The invention of claim 11, wherein each pair of shunt transistors is configured to switch in and out the corresponding passive resistor to cause the differential comparator to operate with hysteresis.

16. The invention of claim 15, wherein voltages drops across the first and second passive resistors are controllable such that the hysteresis is controllable.

17. The invention of claim 15, wherein voltages drops across the first and second passive resistors are fixed such that the hysteresis is fixed.

18. An integrated circuit having a differential comparator configured to receive first and second primary inputs and to generate an output corresponding to a comparison between the first and second primary inputs, the differential comparator comprising:
   (a) an offset comparator configured to generate the output of the differential comparator in response to first and second comparator inputs;
   (b) a first processing path configured to receive the first primary input and to generate the first comparator input; and
   (c) a second processing path configured to receive the second primary input and to generate the second comparator input, wherein at least one of the first and second processing paths comprises:

(1) passive means for generating an offset voltage relative to a corresponding one of the first and second primary inputs; and (2) switching means for switching in and out the passive means, wherein:

the switching means is configured to switch in and out the passive means to cause the differential comparator to operate with hysteresis;

the offset voltage from the passive means is controllable such that the hysteresis is controllable; and the passive means is a passive resistor, the switching means is a pair of shunt transistors connected in parallel with the passive resistor, and the pair of shunt transistors is controlled by the output of the differential comparator.

19. The invention of claim 18, wherein the switching means is configured to switch in and out the passive resistor to cause the differential comparator to operate with hysteresis.

20. An integrated circuit having a differential comparator configured to receive first and second primary inputs and to generate an output corresponding to a comparison between the first and second primary inputs, the differential comparator comprising:

(a) an offset comparator configured to generate the output of the differential comparator in response to first and second comparator inputs;

(b) a first processing path configured to receive the first primary input and to generate the first comparator input; and (c) a second processing path configured to receive the second primary input and to generate the second comparator input, wherein at least one of the first and second processing paths comprises:

(1) passive means for generating an offset voltage relative to a corresponding one of the first and second primary inputs; and (2) switching means for switching in and out the passive means, wherein the switching means comprises two transistors in parallel for connecting/disconnecting the passive means to/from the first input of the offset comparator to control the output of the offset comparator.

21. The invention of claim 20, wherein:

the passive means is a passive resistor;

the switching means is controlled by the output of the differential comparator; and the switching means is configured to switch in and out the passive resistor to cause the differential comparator to operate with hysteresis.

* * * * *